(12) United States Patent
Roy

(10) Patent No.: US 10,641,868 B2
(45) Date of Patent: May 5, 2020

(54) RGB AND Z PHOTO-DIODE PIXEL ARRAY KERNEL ORGANIZATION

(71) Applicant: STMicroelectronics (Crolles 2) SAS, Crolles (FR)

(72) Inventor: Francois Roy, Seyssins (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 252 days.

(21) Appl. No.: 15/805,711

(22) Filed: Nov. 7, 2017

(65) Prior Publication Data
US 2019/0137609 A1    May 9, 2019

(51) Int. Cl.
| | |
|---|---|
| G01S 7/481 | (2006.01) |
| H01L 27/146 | (2006.01) |
| G01S 17/89 | (2020.01) |
| G01S 17/42 | (2006.01) |
| H04N 5/369 | (2011.01) |
| H04N 9/04 | (2006.01) |
| G01S 7/4914 | (2020.01) |
| H04N 5/378 | (2011.01) |

(52) U.S. Cl.
CPC .......... *G01S 7/4816* (2013.01); *G01S 7/4914* (2013.01); *G01S 17/42* (2013.01); *G01S 17/89* (2013.01); *H01L 27/14605* (2013.01); *H01L 27/14612* (2013.01); *H04N 5/36965* (2018.08); *H04N 9/04553* (2018.08); *H01L 27/14645* (2013.01); *H04N 5/378* (2013.01); *H04N 9/045* (2013.01)

(58) Field of Classification Search
CPC ........ G01S 7/4816; G01S 17/89; G01S 17/42; G01S 7/4914; H01L 27/14605; H01L 27/14612; H01L 27/14645; H04N 5/378; H04N 9/045; H04N 5/36965; H04N 9/04553
See application file for complete search history.

(56) References Cited

U.S. PATENT DOCUMENTS

| | | | |
|---|---|---|---|
| 2010/0073462 A1* | 3/2010 | Lee | H04N 5/347 348/46 |
| 2011/0051119 A1* | 3/2011 | Min | G01S 7/491 356/5.1 |
| 2013/0010072 A1* | 1/2013 | Kim | H01L 27/14609 348/46 |
| 2013/0020463 A1* | 1/2013 | Lee | H04N 5/357 250/206 |
| 2014/0347442 A1* | 11/2014 | Wang | H04N 5/2256 348/46 |
| 2017/0192090 A1 | 7/2017 | Roy et al. | |
| 2017/0194368 A1 | 7/2017 | Roy et al. | |

* cited by examiner

*Primary Examiner* — Que Tan Le
*Assistant Examiner* — Jennifer D Bennett
(74) *Attorney, Agent, or Firm* — Slater Matsil, LLP

(57) ABSTRACT

A sensor array includes pixel kernels, wherein each pixel kernel includes RGB pixels, the RGB pixels being configured to provide a plurality of color signals, and Z pixels each having a single memory element, the Z pixels being configured to provide a single TOF signal. Each pixel kernel includes two to four Z pixels. The RGB and Z pixels can be integrated together on a single sensor array.

20 Claims, 6 Drawing Sheets

RGB AND Z PHOTO-DIODE PIXEL ARRAY KERNEL ORGANIZATION

TECHNICAL FIELD

The present disclosure relates to a distance sensor operating based on a Time-Of-Flight (TOF) measurement.

BACKGROUND

In a TOF sensor, a light source emits light towards a scene. A time-of-flight detection pixel, or TOF pixel, of the sensor receives the light reflected by a point of the scene conjugate with this pixel. The TOF pixel is also sometimes referred to as a "Z" pixel. The measurement of the time of flight, that is, of the time taken by the light to travel from the light source to the point of the scene of which the pixel is conjugate, and from this point to the pixel, enables to calculate the distance separating the pixel from this point.

In the case where a three-dimensional image of a scene is desired to be obtained, the TOF sensor comprises an array of TOF pixels to measure the distance separating each pixel from the point of the scene conjugate with this pixel. This provides a mapping of the distances separating the sensor from the different points of the scene conjugate with the pixels, and a three-dimensional image of the scene can then be reconstructed from this distance mapping. Current TOF pixels have relatively large dimensions. For example, a TOF pixel comprising a SPAD-type photodiode ("Single Photon Avalanche Diode") may have a surface area in the order of 30 μm by 3 μm.

SUMMARY

In accordance with an embodiment of the invention, a pixel kernel comprises a plurality of RGB pixels; a first Z pixel having a single memory element at a first location; and a second Z pixel having a single memory element at a second location. The pixel kernel can include a third Z pixel having a single memory element at a third location, wherein the first and second Z pixels are located in a first row of the pixel kernel, and the third Z pixel is arranged in a second row of the pixel kernel. The pixel can also include a fourth Z pixel having a single memory element at a fourth location, wherein the first and second Z pixels are located in a first row of the pixel kernel, and the third and fourth Z pixels are located in a second row of the pixel kernel. At least one of the RGB pixels and the Z pixels comprises a photosensitive element and a pass transistor.

In accordance with another embodiment of the invention, a sensor array comprises a plurality of pixel kernels, wherein each pixel kernel comprises a plurality of RGB pixels, the plurality of RGB pixels being configured to provide a plurality of color signals; and a plurality of Z pixels each having a single memory element, the plurality of Z pixels being configured to provide a single TOF signal. The plurality of Z pixels comprises a first Z pixel at a first location and a second Z pixel at a second location. The sensor array can also include a third Z pixel at a third location, wherein the first and second Z pixels are located in a first row of each pixel kernel, and the third Z pixel is arranged in a second row of each pixel kernel. The sensor array can also include a fourth Z pixel at a fourth location, wherein the first and second Z pixels are located in a first row of each pixel kernel, and the third and fourth Z pixels are located in a second row of each pixel kernel. At least one of the RGB pixels and at least one of the Z pixels comprises a photosensitive element and a pass transistor.

In accordance with another embodiment of the invention, a method comprises providing a pixel kernel including a plurality of RGB pixels and a plurality of Z pixels each having a single memory element; configuring the plurality of RGB pixels to provide a plurality of color signals; and configuring the plurality of Z pixels to provide a single TOF signal. Providing a plurality of Z pixels comprises providing a first Z pixel at a first location in the pixel kernel and placing a second Z pixel at a second location in the pixel kernel. A third Z pixel at a third location in the pixel kernel and a fourth Z pixel at a fourth location in the pixel kernel can also be provided. Providing a single TOF signal comprises combining a first signal from a first Z pixel with a second signal from a second Z pixel.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
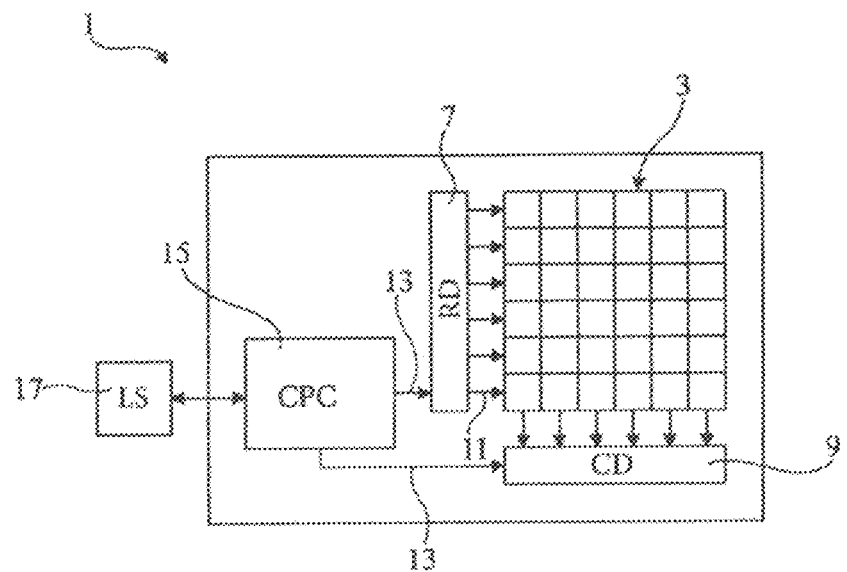
FIG. 1 is a top view schematically showing an example of a TOF sensor.

The same elements have been designated with the same reference numerals in the various drawings and, further, the various drawings are not to scale. For clarity, only those elements which are useful to the understanding of the described embodiments have been shown and are detailed.

FIG. 1 is a simplified top view of an example of a TOF sensor. Sensor 1 comprises an array 3 of TOF pixels, for example, an array of 1,000 rows by 1,000 columns. Array 3 is associated with a row decoder 7 and with a column decoder 9. Row decoder 7 delivers signals 11 enabling to select one or the other of the array rows. Column decoder 9 enables to read the information from the pixels of a selected row. Row decoder 7 and column decoder 9 are controlled by signals 13 delivered by a control and processing circuit 15. Control and processing circuit 15, for example, comprises a processor associated with one or a plurality of memories. Sensor 1 is associated with a light source 17 to illuminate a scene for which a three-dimensional image is desired to be obtained. Light source 17 is for example a laser having a wavelength which may be in the range from 500 to 1,000 nm. Light source 17 is connected to control and processing circuit 15 to synchronize the control signals applied to the TOF pixels of array 3 and light source 17.

In the following description, the case of a sensor 1 where light source 17 emits a sinusoidal signal LE having a frequency which may be in the range from 20 to 100 MHz, for example, 25 MHz, is considered. For each pixel, phase-shift φ between the emitted light signal LE and the light signal LR received by this pixel is determined. The distance separating the pixel from its conjugate point is then determined from phase shift φ.

Figure 2:
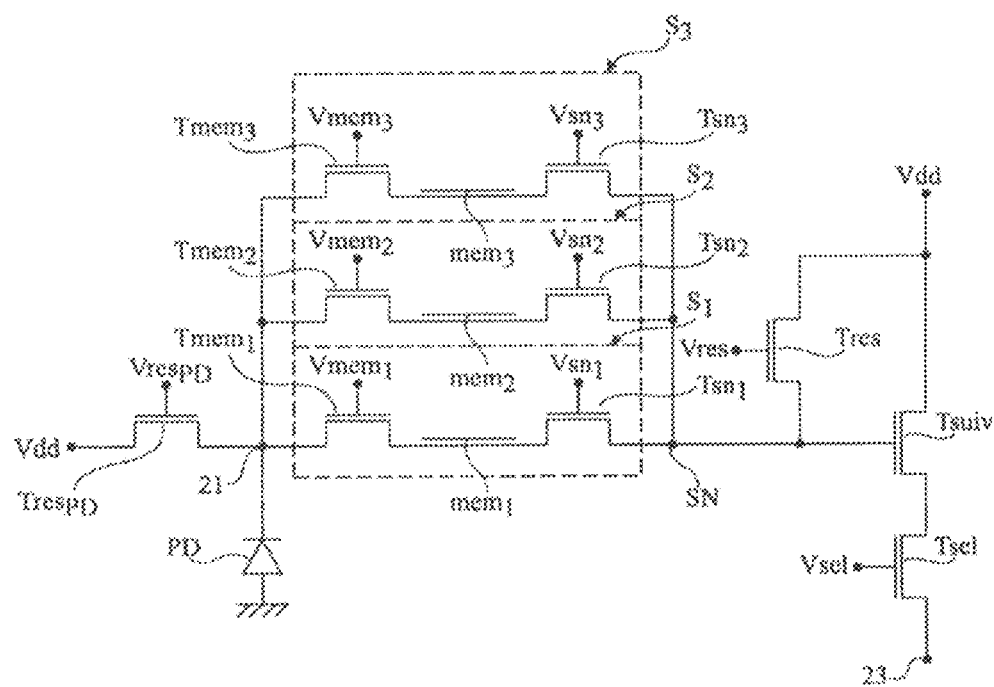
FIG. 2 shows an example of a TOF pixel circuit.

FIG. 2 shows an example of a TOF pixel circuit.

The TOF pixel comprises a photosensitive element (photodiode PD) having a terminal connected to a node 21 and having another terminal connected to a low reference potential, for example, ground. Node 21 is coupled to sense node SN via three substantially identical assemblies S1, S2, and S3 connected in parallel between nodes 21 and SN. Each assembly Si, with "i" equal to one, two, or three in this example, (or four or more assemblies in other configurations not shown in FIG. 2) comprises a transfer N-channel MOS transistor, Tmemi, a charge storage area memi, and a sense N-channel MOS transistor, Tsni. The source of transistor Tmemi is connected to node 21, and the drain of transistor Tmemi is connected to a terminal of storage area memi. Transistor Tmemi is controlled by a signal Vmemi applied to its gate. The source of transistor Tsni is connected to the other terminal of storage area memi, and the drain of transistor Tsni is connected to sense node SN. Transistor Tsni is controlled by a signal Vsni applied to its gate. Examples of storage areas memi are known in the art including capacitive memory storage that can also be integrated with other circuit components on an integrated circuit. Particular examples of storage areas are described in co-pending patent applications 2017/0194368 and 2017/0192090 that are both entitled "Time-Of-Flight Detection Pixel" and are both hereby incorporated by reference in their entirety.

The TOF pixel is associated with a sense device that may be common to a plurality of pixels, for example, four pixels. The sense device comprises a precharge N-channel MOS transistor, Tres, an N-channel MOS transistor assembled as a follower source, Tsuiv, and a selection N-channel MOS transistor, Tsel, connected as shown in FIG. 2. Sense node SN is coupled to a high reference potential, for example, power supply potential Vdd, by transistor Tres, the latter being controlled by a signal Vres applied to its gate. Sense node SN is also coupled to the gate of transistor Tsuiv having its drain coupled to the high reference potential, and having its source coupled to an output line 23 of the pixel circuit via transistor Tsel, transistor Tsel being controlled by a signal Vsel applied to its gate.

In this example, the TOF pixel further comprises an N-channel MOS transistor, TresPD, for resetting photosensitive element PD. The source of transistor TresPD is connected to node 21 and the drain of transistor TresPD is connected to high potential Vdd. Transistor TresPD is controlled by a signal VresPD applied to its gate.

To determine the phase shift φ between the emitted light signal LE and the light signal LR received by the pixel, signal LR is sampled by transferring, successively and at regular intervals, charges photogenerated in the photosensitive element towards storage areas mem1, and then mem2, and finally mem3. The total duration to carry out these three successive transfers is equal to a period of signals LE and LR. Further, these three successive transfers are repeated a large number of times, for example, at least 100,000 times. The charges stored in the storage areas are then read by transferring, to node SN, the charges from area mem1, and then from area mem2, and finally from area mem3.

An embodiment of the TOF pixel of FIG. 2 will now be described in further detail in relation with the timing diagram of FIG. 3.

Figure 3:
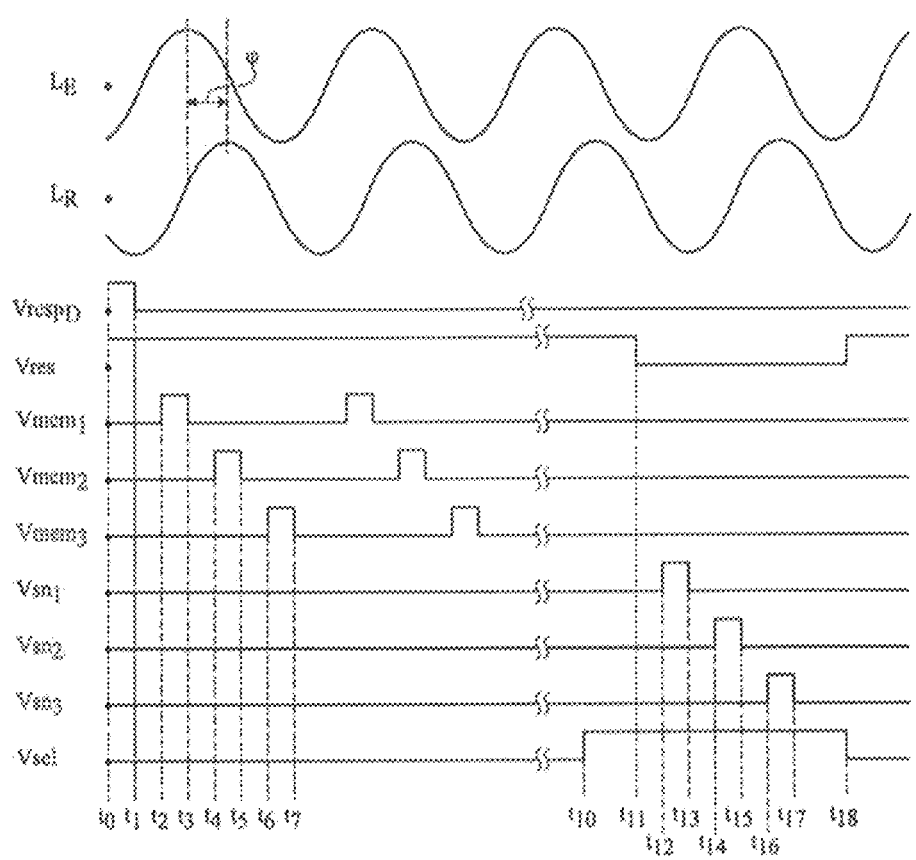
FIG. 3 is a timing diagram illustrating a control mode for the TOF pixel of FIG. 2.

FIG. 3 is a timing diagram of light signal LE emitted by light source 17 associated with sensor 1, of light signal LR received by the TOF pixel, and of digital signals VresPD, Vres, Vmemi, Vsni, and Vsel. By default, signals VresPD, Vmemi, Vsni, and Vsel are at a low level and signal Vres is at a high level.

An integration phase proceeds during the time sequence from time t0 to time t11, and a transfer phase proceeds during the time sequence from time t11 until the end of the timing diagram shown in FIG. 3.

A resetting of photosensitive element PD is first performed by setting transistor TresPD to the on state (signal VresPD in the high state) between times t0 and t1. An integration cycle of the pixel then starts and is synchronized on signal LE.

During the integration cycle, the charges photogenerated in photosensitive area PD are transferred to storage areas memi. To achieve this, transfer transistors Tmemi are each set to the on state in turn. More particularly, transistor Tmem1 is set to the on state (Vmem1 high) between times t2 and t3, transistor Tmem2 is set to the on state (Vmem2 high) between times t4 and t5, and transistor Tmem3 is set to the on state (Vmem3 high) between times t6 and t7. As previously indicated, these three transfers are then repeated a large number of times. All along the integration cycle, signal Vres is in the high state, transistor Tres is on, and the voltage of sense node SN is substantially equal to the high reference potential.

At the end of the integration cycle, from a time no, the charges stored in each of storage areas memi are read. To achieve this, sense transistors Tsni are each in turn set to the on state, and the voltage level on node SN is measured and stored after each reading of the charges stored in a storage area memi. More particularly, transistor Tsel is set to the on state (Vsel high) at time t10 and precharge transistor Tres is set to the off state (Vres low) at a time t11. Transistor Tsn1 is then set to the on state (Vsn1 high) between successive times t12 and t13, after which the sequence on Tres and Tsn is repeated by the application of a new precharge pulse on transistor Tres before the reading of the second sample, followed by a switching to the on state of transistor Tsn2 (Vsn2 high) between successive times t14 and t15, and, finally, this sequence is repeated a third time before the application of a pulse on Tres and the reading of the third sample when transistor Tsn3 is set to the on state (Vsn3 high) between successive times t16 and t17. First, second, and third voltage levels of node SN are measured and stored, respectively between times t13 and t14, between times t15 and t16, and between times t17 and a time t18. At time t18, signal Vsel is set to the low state and signal Vres is set back to the high state. A new integration cycle may then start.

In this embodiment, the first, second, and third measured voltage levels are representative of the charges stored, respectively, in storage area mem1, in storage area mem2, and in storage area mem3. In a preferred alternative embodiment, a resetting of sense node SN is provided after each reading of the charges stored in a storage area memi. In this case, the first, second, and third voltage levels are representative of the charges stored in a single storage area, respectively mem1, mem2, and mem3.

These three voltage levels enable to determine phase shift φ between light signals LE and LR, and thus to deduce therefrom the distance separating the pixel from the point in the scene conjugate with the pixel.

Although an embodiment and a control mode of a TOF pixel circuit comprising three identical assemblies Si, phase shift φ between signals LE and LR may also be determined by using a TOF pixel comprising more than three assemblies Si, for example, four assemblies Si.

As an example, the duration of a transfer towards a storage area memi is in the range from 5 to 30 ns. The duration separating two transfers to a same storage area memi is for example 40 ns when the frequency of these signals is 25 MHz. In this case, the duration of an integration cycle may be approximately 10 ms when the charge transfers to each of storage areas memi are performed 250,000 times each. The duration of a charge transfer from a storage area memi to sense node SN is for example in the range from 1 to 10 µs.

In a pixel, within a few nanoseconds, few charges are photogenerated in photosensitive element PD, for example, from 0 to 10 charges. Such charges should be integrally transferred to a storage area memi. In particular, no charge should remain blocked in photosensitive element PD or in the channel of the corresponding transistor Tmemi.

Further, in an embodiment, array 3 of sensor 1 may comprise a plurality of groups of pixels (pixel array kernels), each group or kernel comprising a TOF pixel (Z pixel) and pixels capable of detecting red, green, and blue light to obtain a three-dimensional color image of a scene (RGB pixels). In the simplest configuration, a pixel array kernel will include an R pixel, a G pixel, a B pixel, and a Z pixel, with each pixel occupying a quadrant thereof. In an embodiment, the Z pixel may be too large for this simple configuration, and thus other pixel array kernels for accommodating the large size of the Z pixel is described in further detail below.

Figure 4:
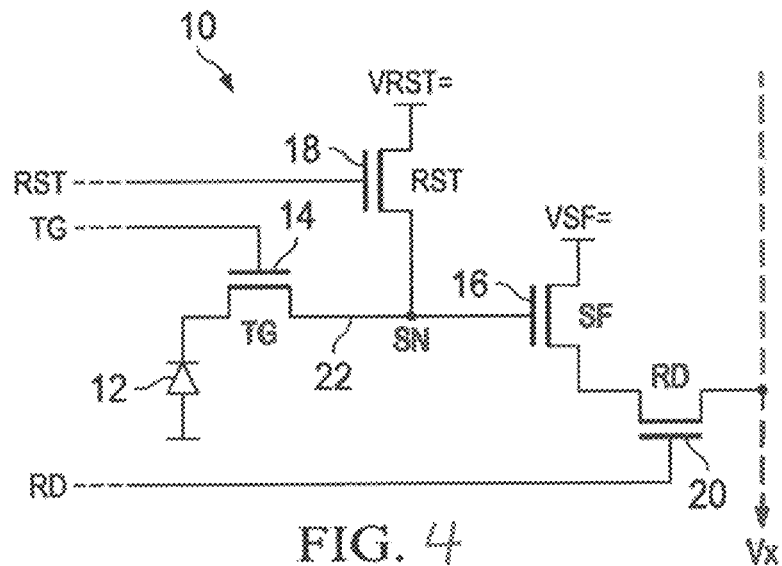
FIG. 4 shows an example of a 4T (four transistor) RGB pixel circuit.

A color CMOS image sensor has a pixel array including the RGB pixels. FIG. 4 shows a pixel architecture, based on what is known as a 4T (four transistor) pixel 10. The pixel 10 comprises a photodiode 12, a transfer gate transistor 14, a source follower transistor 16, a reset transistor 18 and a read transistor 20. These transistors act to reset, expose and then read out data from the photodiode. The transfer gate transistor 14 is controlled by a signal TG, the reset transistor 18 is controlled by a signal RST and the readout transistor 20 is controlled by the read signal RD. The source follower transistor 16 has its gate tied to a sense node (SN) 22.

In more detail, the reset transistor 18 receives the reset signal RST at its gate, its drain is connected to a voltage VRST and its source is connected to the sense node 22. The source follower transistor 16 has its drain connected to a source follower supply voltage VSF and its source connected to the drain of the read transistor 20. The read signal RD is coupled to the gate of the read transistor 20. The source of the read transistor 20 provides the output voltage Vx. The transfer gate transistor 14 has its gate coupled to the control signal TG. The drain of the transfer gate transistor is connected to the sense node 22 while its source is connected to the photodiode 12.

The transistors typically operate with a pinned photodiode structure and Correlated Double Sampling (CDS) to remove "kTC" noise associated with the reset operation. In Correlated Double Sampling, the output of the pixel is measured twice: once in a reset condition (in this case at "black level" when the only level change is resultant from noise) and once in a condition including the signal (which still includes the "black level" noise). The value measured from the signal condition is then subtracted from the reset condition so as to remove the "black level" noise offset. The double sampling operation also removes fixed noise sources such as variation in the threshold voltage of the source follower transistor.

The pixel needs to have appropriate voltage levels applied at defined time intervals. The voltage levels of the control signal TG (to transfer the pixel signal level to the sense node), RST (to reset the sense node and photodiode) and RD (or READ) (to read/select the pixel to the Vx line) as well as the pixel power supply (providing VRST and VSF), should comprise little noise, since any noise may couple directly to the sense node or column parallel output voltage level Vx and corrupt the image data.

The amount of charge that a photodiode can collect before saturating is known as the full well. It is desirable to have a large full well so that many photons can be collected from the incoming illumination and the imaging range extended. During the pixel read operation the collected charge is transferred to the sense node which causes a downward voltage change (of which the magnitude is determined by the capacitance on the sense node). A large voltage change per electron transferred (known as conversion factor) is desirable to maximize the signal swing but if the transferred charge is large, the full voltage swing may not be achieved. Limitations can come from one or more of the following (but are not limited to):

1. A requirement to have a sense node voltage above the pinning voltage of the photodiode. If the sense node voltage is too low, full charge transfer will not occur and signal will be lost.

2. Limited swing available on the Vx column. If the sense node voltage is too low the source follower may not be able to correctly buffer the sense node voltage. The Vx voltage lower limit may be dictated by the column current source which requires a voltage drop to operate correctly.

It is thus desirable in some embodiments to maximize the black level of the sense node. This black level is the voltage after the RESET transistor has been turned OFF and before the TG signal is pulsed. It may be desirable to maximize the change in the sense node and Vx voltage.

The reset signal will typically vary between the low and high levels.

Figure 5:
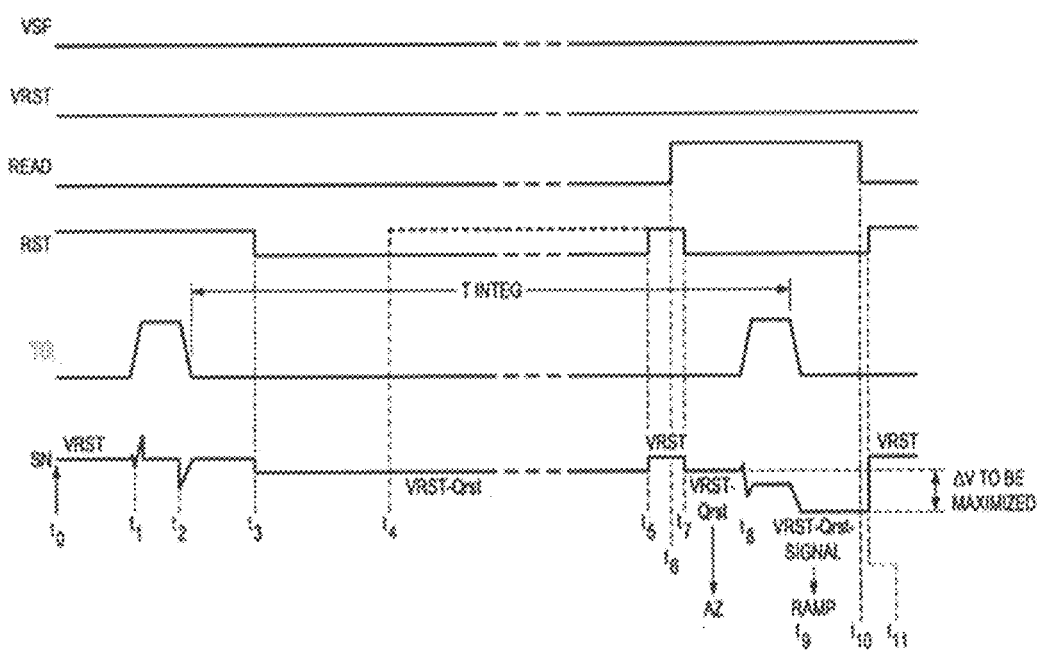
FIG. 5 shows a timing diagram for the pixel circuit of FIG. 4.

Reference is made to FIG. 5 which shows the voltage of the different signals over time.

The voltage VSF is held at a first voltage V. The reset voltage VRST is held at second voltage V.

Initially, at time t0, the read signal READ is held at third, non-read voltage V. In the time period t0 to t1, the signal TG is at a fourth voltage which may be a negative voltage in some embodiments. At time t1, the TG signal is taken up to fifth voltage which is higher than the fourth voltage and then back down to the fourth voltage at time t2. The voltage on the SN is initially VRST. There will be a voltage spike in the voltage on node SN corresponding to the signal TG toggling up to the fifth voltage level. There is a corresponding downward spike on node SN when the voltage TG is returned back to the fourth voltage level.

The RST signal is initially at a sixth voltage and is then dropped at time t3 to a seventh voltage level. In some embodiments, the RST signal is optionally returned to the sixth voltage level at time t4. From time t3 to t5, the voltage on the SN is VRST-Qrst. The integration period in this embodiment is from time t2 to time t9.

At time t5 the RST signal and just beyond at time t6 the READ signal are respectively raised to higher voltage levels, that is the sixth voltage level in the case of the RST signal and a eighth voltage level in the case of the READ signal. This starts the read period of the pixel. The RST signal is then set to its low level, the seventh voltage level at time t7. Again, the voltage on the SN node will drop to VRST-Qrst.

At time t8 the TG signals increase to the fifth voltage which turns on the TG device causing a positive coupling onto the sense node. The upward coupling will be in opposition to any downward voltage shift caused by the charges transferred from the photodiode. When the TG voltage toggles back down at time t9, the voltage on the SN node couples downward reversing the previous upward kick. The voltage is VRST-Qrst-signal.

At time d0 and t11 the column voltage has been converted by an on-chip ADC so the read signal is set to the lower voltage, the third voltage, and the RST signal set to the higher voltage, the sixth voltage to disable the pixel. The voltage on the node SN will increase to VRST. The reference to ΔV represents the signal voltage. It is this voltage which some embodiments aim to maximize.

In this example, the signal RST is low during the integration time. In other arrangements, this signal could be high during the integration time.

Figure 6:
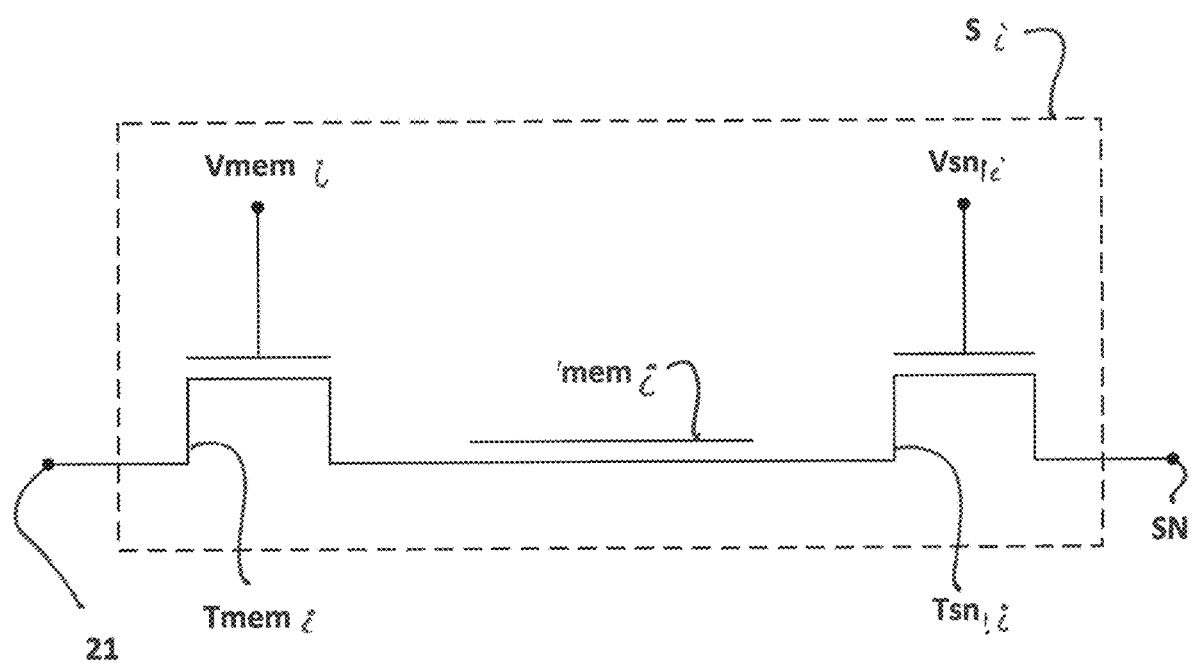
FIG. 6 shows a memory assembly including a single memory location for use in a Z pixel portion according to an embodiment.

Referring to FIG. 6, the memory area numbering convention is explained in further detail for use in the RGBZ pixel kernel described below. In an embodiment, the pixel kernel will include two or more distributed Z pixel portions having only one charge storage area memi and at least three associated RGB pixels. Each of the distributed Z pixel portions of the pixel kernel will be essentially the same circuit as shown and previously described in FIG. 2, except that only one storage area is included per distributed Z pixel as described above. However, each Z pixel may contain other circuit components such as an "anti-blooming" device or other such diodes or additional or fewer transistors than those shown in FIG. 2. Numerous configurations for a Z pixel circuit are known to those skilled in the art. Each of these circuit components or configurations will be repeated in each distributed Z pixel portion, according to an embodiment.

Each assembly Si, that is used in the distributed Z pixel portion of the pixel kernel according to an embodiment has only one memory storage area memi as is shown in FIG. 6. The designation of the assembly Si is still used because each assembly is a distributed component of a Z pixel including a plurality "i" number of physically separated storage areas associated with the function of a single Z pixel, for example two, three, or four physically separated storage areas. In an example, a single Z pixel having four memory areas will include four distributed Z pixel portion each having four memory storage areas wherein a single memory storage area memi is associated with a first Z pixel portion at a first array location in a pixel kernel, a single memory storage area mem2 is associated with a second Z pixel portion at a second array location in the pixel kernel, a single memory storage area mem3 is associated with a third Z pixel portion at a third array location in the pixel kernel, and a single memory storage area mem4 is associated with a fourth Z pixel portion at a fourth array location in the pixel kernel.

The assembly shown in FIG. 6 is suitable for use in a distributed Z pixel portion and thus comprises a single transfer N-channel MOS transistor, Tmemi, a single charge storage area memi, and a single sense N-channel MOS transistor, Tsni. The source of transistor Tmemi is connected to node 21, and the drain of transistor Tmemi is connected to a terminal of storage area memi as previously described. Transistor Tmemi is controlled by a signal Vmemi applied to its gate as previously described. The source of transistor Tsni is connected to the other terminal of storage area memi, and the drain of transistor Tsni is connected to sense node SN as previously described. Transistor Tsni is controlled by a signal Vsni applied to its gate as previously described. In an embodiment, assembly Si may not include one of the transfer transistors shown, but will include as a minimum the memory storage area memi. Nodes SN and 21 correspond to the same nodes as shown in FIG. 2. All of the other pixel transistors and components, except for the memory area, are transferred to the individual distributed Z pixel portions as previously described.

Figure 7:
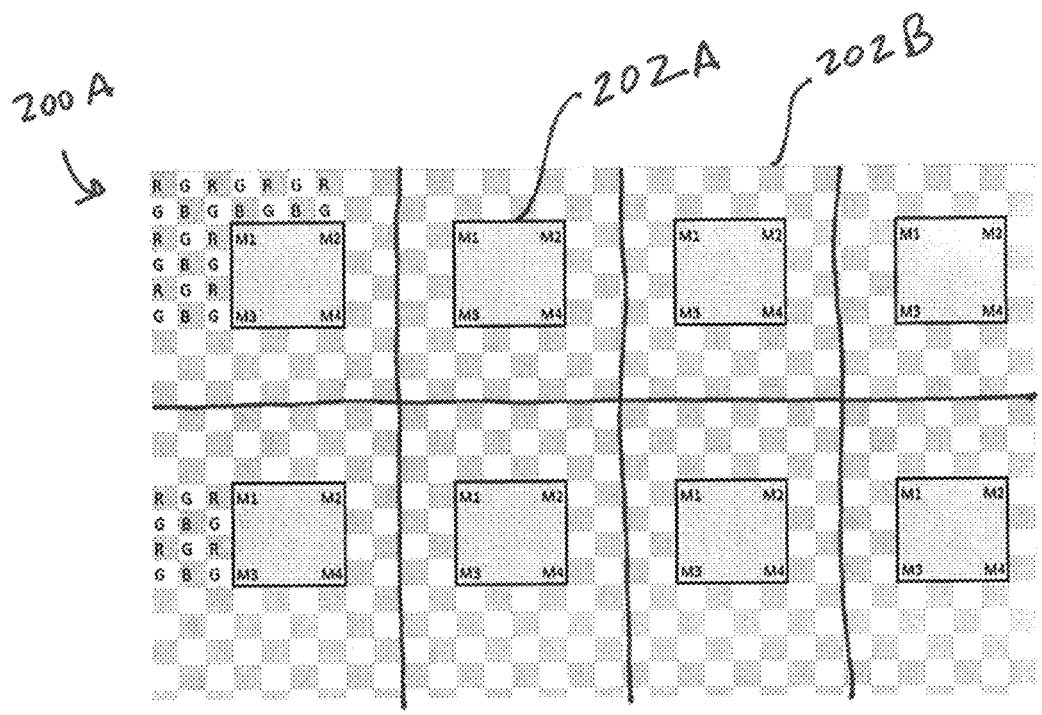
FIGS. 7-10 shows TOF sensor array layouts including distributed Z pixel portions according to embodiments.

FIG. 7 shows a TOF array 200A including a plurality of RGBZ pixel kernels 202B, including a plurality of RGB pixels and a single Z pixel 202A including four memory storage locations M1, M2, M3, and M4. Note that in FIG. 7 distributed Z pixel portions are not used. Z pixel 202A includes the four memory storage locations all together substantially as illustrated in FIG. 2.

Figure 8:
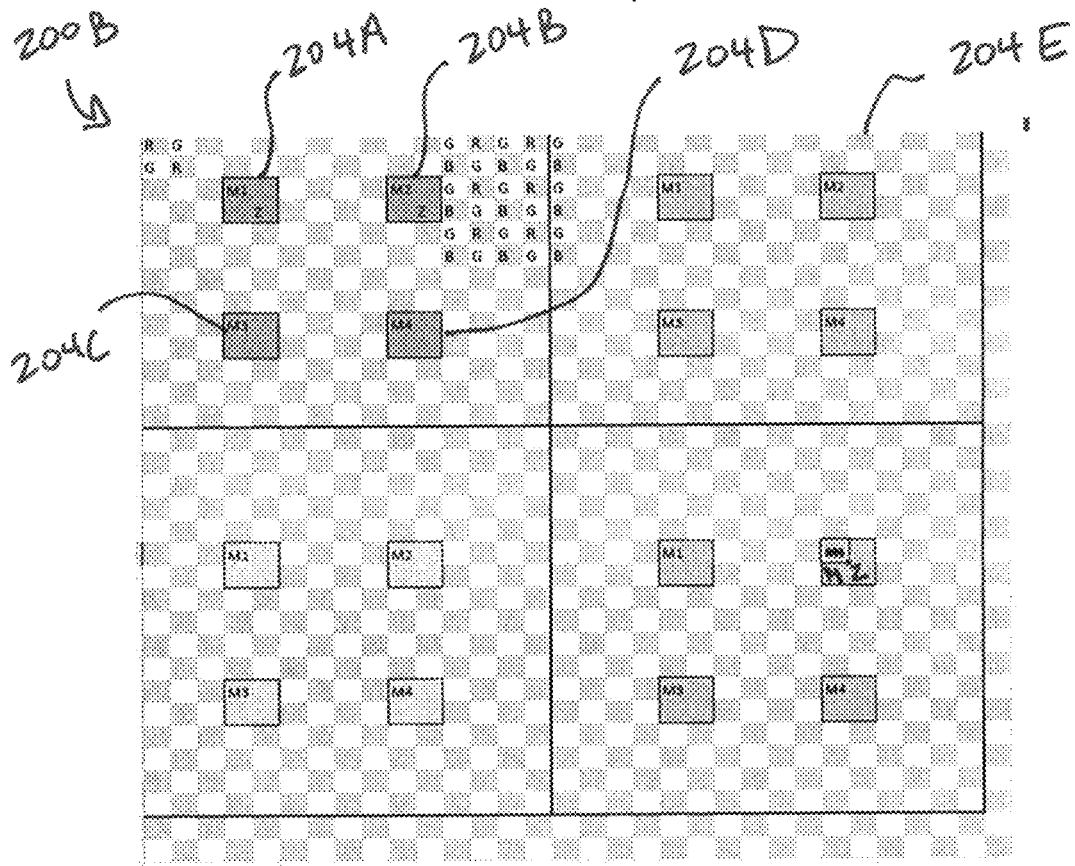

FIG. 8 shows a TOF array 200B according to an embodiment, including a plurality of RGBZ pixel kernels 204E, including a plurality of RGB pixels and four distributed Z pixel portions 204A, 204B, 204C, and 204D, each respectively including a single memory storage location M1, M2, M3, and M4. For example, Z pixel portion 204A will include the transistors TresPD, Tres, Tsuiv, Tsel, and photodiode PD as previously described and shown in FIG. 2, but only a single memory storage location M1. As another example, Z pixel portion 204C will include the transistors TresPD, Tres, Tsuiv, Tsel, and photodiode PD as previously described and shown in FIG. 2, but only a single memory storage location M1. The operation of TOF array 200B is described in further detail below. TOF array 200B thus accommodates the function of a single Z pixel including four memory locations, but in a manner that is more easily integrated onto the array with the surrounding RGB pixels. While a representative configuration of Z pixel portions are shown in FIG. 8, other configurations are possible. For example, Z pixel portions 204C and 204D could be offset with respect to Z pixel portions 204A and 204B. The number of RGB pixels in each pixel kernel 204E is not fixed, but is determined by testing data to determine a proper balance between TOF performance and color performance. This balance will vary according to the requirements of a particular application and thus additional or fewer RGB pixels can be included in the pixel kernel.

Figure 9:
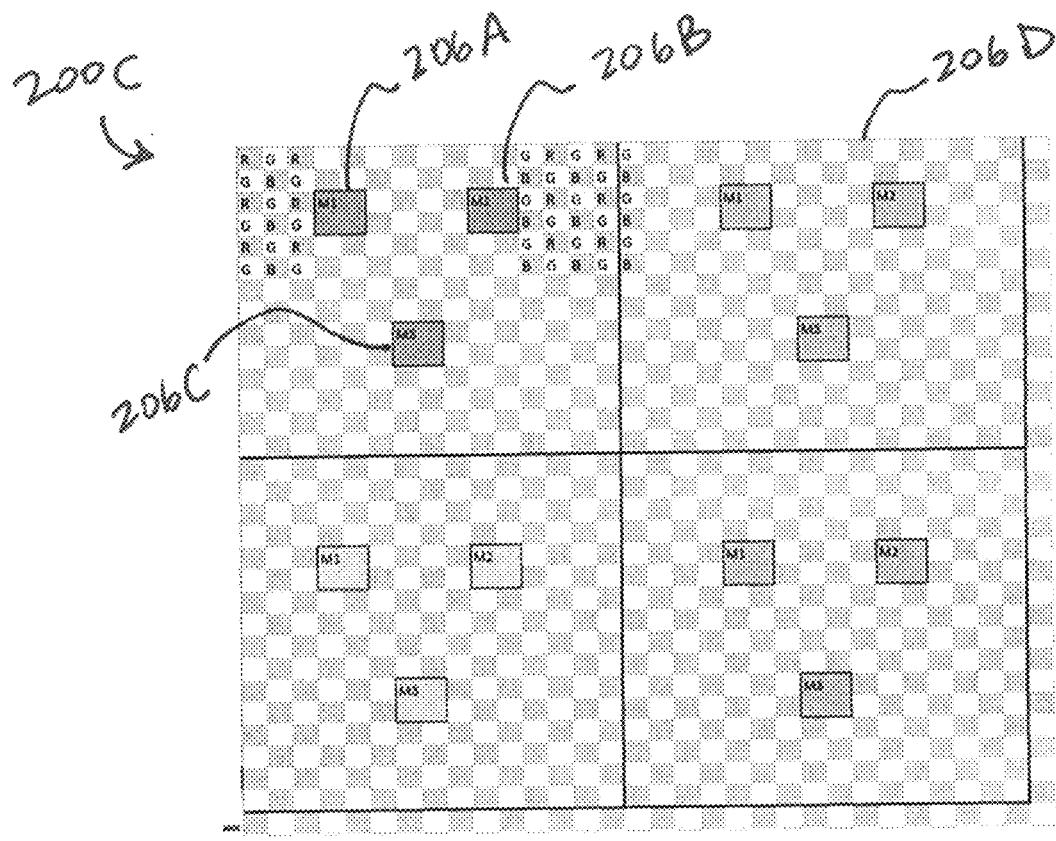

FIG. 8 shows a TOF array 200C according to an embodiment, including a plurality of RGBZ pixel kernels 206D, including a plurality of RGB pixels and three distributed Z pixel portions 206A, 206B, and 204C, each respectively including a single memory storage location M1, M2, and M3. For example, Z pixel portion 206A will include the transistors TresPD, Tres, Tsuiv, Tsel, and photodiode PD as previously described and shown in FIG. 2, but only a single memory storage location M1. As another example, Z pixel portion 206C will include the transistors TresPD, Tres, Tsuiv, Tsel, and photodiode PD as previously described and shown in FIG. 2, but only a single memory storage location M3. The operation of TOF array 200C is described in further detail below. TOF array 200C thus accommodates the function of a single Z pixel including three memory locations, but in a manner that is more easily integrated onto the array with the surrounding RGB pixels. While a representative configuration of Z pixel portions are shown in FIG. 9, other configurations are possible. For example, Z pixel portion 206C could be offset to the left or right with respect to Z pixel portions 206A and 206B. The number of RGB pixels in each pixel kernel 206D is not fixed, but is determined by testing data to determine a proper balance between TOF performance and color performance. This balance will vary according to the requirements of a particular application and thus additional or fewer RGB pixels can be included in the pixel kernel.

Figure 10:
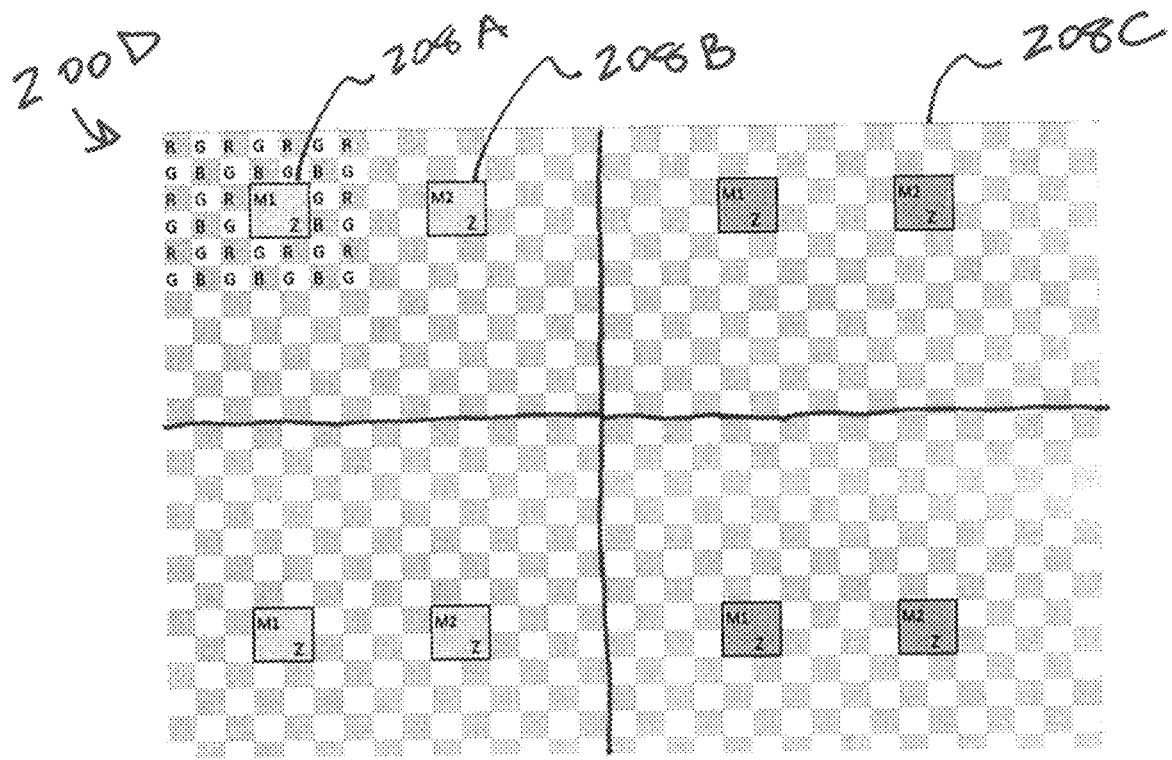

FIG. 10 shows a TOF array 200D according to an embodiment, including a plurality of RGBZ pixel kernels 208C, including a plurality of RGB pixels and two distributed Z pixel portions 208A and 208B, each respectively including a single memory storage location M1 and M2. Z pixel portion 208A will include the transistors TresPD, Tres, Tsuiv, Tsel, and photodiode PD as previously described and shown in FIG. 2, but only a single memory storage location M1. Z pixel portion 208B will include the transistors TresPD, Tres, Tsuiv, Tsel, and photodiode PD as previously described and shown in FIG. 2, but only a single memory storage location M2. The operation of TOF array 200D is described in further detail below. TOF array 200D thus accommodates the function of a single Z pixel including two memory locations, but in a manner that is more easily integrated onto the array with the surrounding RGB pixels. While a representative configuration of Z pixel portions are shown in FIG. 10, other configurations are possible. For example, Z pixel portion 208A could be located closer or further apart from Z pixel portion 208B. The number of RGB pixels in each pixel kernel 208C is not fixed, but is determined by testing data to determine a proper balance between TOF performance and color performance. This balance will vary according to the requirements of a particular application and thus additional or fewer RGB pixels can be included in the pixel kernel.

In operation, TOF arrays 200A and 200B use a similar, and array 200C uses the same Z pixel timing diagram of FIG. 3, although the physical location of each memory area location is physically separated in the array as is described above. The TOF timing proceeds as described in FIG. 3. The calculation requires each of the demodulated signals associated with each Z pixel portion to recreate the entire stored signal. The signals associated with each Z pixel portion are not sufficient to recreate the entire stored TOF signal as required. The M1, M2, and M3 signals are sequentially transferred to recreate the entire stored signal, according to an embodiment.

In an embodiment, the Z pixel circuit of FIG. 2 can include additional or fewer transistors, diodes, and other circuit components. The configuration of the Z pixel circuit, except for the memory assembly, will be replicated in each of the Z pixel portions. The single memory assembly of FIG. 6 can include both transistors as shown or only one transistor, but will, at a minimum include the single memory storage location as shown.

Since the Z pixel footprint is too large and difficult to merge with the RGB pixels in a small pixel array, an array including physically separated and distributed Z pixel portions each including a single memory area has been described. Z pixels including two, three, four, or more memory areas can be accommodated inside the array. The TOF (Z) calculation is performed using all of the distributed Z pixel portions in a pixel kernel, substantially as would be performed for a single Z pixel having a plurality of memory areas. The distributed Z pixel portions according to embodiments allow for a balance between TOF and color performance while accommodating the performance of a Z pixel that would be otherwise too large to effectively integrate on the same sensor with a plurality of small RGB pixels. The sensor as described is not limited to a particular Z pixel circuit, and RGB pixel circuit, or a capacitive memory area circuit or technology.

While a one-by-one, or two-by-two RGB footprint for the Z pixel portions has been shown in FIGS. 7-10, larger RGB footprints, such as three-by-three, or four-by-four, could be used according to embodiments. Also, as previously discussed, the exact circuit used for the RGB pixel or the Z pixels, or Z pixel portions is not fixed, but can be selected from many such circuits that are known in the art.

It is an advantage of embodiments of the invention that a high resolution RGB sensor and a Z image sensor having acceptable resolution comparable with prior art solutions is provided in a manner that is easily integrated in a single RGBZ sensor array.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A pixel kernel comprising:
a plurality of RGB pixels;
a first Z pixel having a single memory element at a first location within the plurality of RGB pixels; and
a second Z pixel having a single memory element at a second location within the plurality of RGB pixels,
wherein at least one of the plurality of RGB pixels are located between the first Z pixel and the second Z pixel, wherein the single memory element at the first location is configured to be accessed during a first time period, wherein the single memory element at the second location is configured to be accessed during a second non-overlapping time period, and wherein the first Z pixel and the second Z pixel are combined to provide a single time of flight signal.

2. The pixel kernel of claim 1, further comprising a third Z pixel having a single memory element at a third location within the plurality of RGB pixels.

3. The pixel kernel of claim 2, wherein the first and second Z pixels are located in a first row of the pixel kernel, and the third Z pixel is arranged in a second row of the pixel kernel.

4. The pixel kernel of claim 2, further comprising a fourth Z pixel having a single memory element at a fourth location within the plurality of RGB pixels.

5. The pixel kernel of claim 4, wherein the first and second Z pixels are located in a first row of the pixel kernel, and the third and fourth Z pixels are located in a second row of the pixel kernel.

6. The pixel kernel of claim 1, wherein the plurality of RGB pixels comprise a photosensitive element and a transfer transistor.

7. The pixel kernel of claim 1, wherein the first and second Z pixels comprise a photosensitive element and a transfer transistor.

8. A sensor array comprising:
a plurality of pixel kernels, wherein each pixel kernel comprises:
a plurality of RGB pixels, the plurality of RGB pixels being configured to provide a plurality of color signals; and
a plurality of Z pixels each having a single memory element, the plurality of Z pixels being configured to provide a single time of flight signal,
wherein at least one of the plurality of RGB pixels are located between the plurality of Z pixels, wherein the single memory element of one of the plurality of Z pixels is configured to be accessed during a first time period, wherein the single memory element of another one of the plurality of Z pixels is configured to be accessed during a second non-overlapping time period, and wherein at least two of the plurality of Z pixels are combined to provide a single time of flight signal.

9. The sensor array of claim 8, wherein the plurality of Z pixels comprises a first Z pixel at a first location and a second Z pixel at a second location.

10. The sensor array of claim 9, further comprising a third Z pixel at a third location.

11. The sensor array of claim 10, wherein the first and second Z pixels are located in a first row of each pixel kernel, and the third Z pixel is arranged in a second row of each pixel kernel.

12. The sensor array of claim 10, further comprising a fourth Z pixel at a fourth location.

13. The sensor array of claim 12, wherein the first and second Z pixels are located in a first row of each pixel kernel, and the third and fourth Z pixels are located in a second row of each pixel kernel.

14. The sensor array of claim 8, wherein at least one of the RGB pixels comprises a photosensitive element and a transfer transistor.

15. The sensor array of claim 8, wherein at least one of the Z pixels comprises a photosensitive element and a transfer transistor.

16. A method comprising:
providing a pixel kernel including a plurality of RGB pixels and a plurality of Z pixels each having a single memory element;
configuring the plurality of RGB pixels to provide a plurality of color signals; and
configuring the plurality of Z pixels to provide a single time of flight signal,
wherein at least one of the plurality of RGB pixels are located between the plurality of Z pixels, wherein a single memory element of one of the plurality of Z pixels is accessed during a first time period, wherein a single memory element of another one of the plurality of Z pixels is accessed during a second non-overlapping time period, and wherein at least two of the plurality of Z pixels are combined to provide a single time of flight signal.

17. The method of claim 16, wherein providing the plurality of Z pixels comprises providing a first Z pixel at a first location in the pixel kernel and placing a second Z pixel at a second location in the pixel kernel.

18. The method of claim 17, further comprising providing a third Z pixel at a third location in the pixel kernel.

19. The method of claim 18, further comprising providing a fourth Z pixel at a fourth location in the pixel kernel.

20. The method of claim 16 wherein providing the single time of flight signal comprises combining a first signal from a first Z pixel with a second signal from a second Z pixel.

* * * * *